(12) United States Patent
Bunting et al.

(10) Patent No.: US 12,198,872 B2
(45) Date of Patent: Jan. 14, 2025

(54) SYSTEMS AND METHODS FOR DETECTING AND REMOVING RESIDUE FROM LOW CURRENT ELECTRICAL CONTACTS

(71) Applicant: THE BOEING COMPANY, Chicago, IL (US)

(72) Inventors: Michael James Bunting, Seal Beach, CA (US); Dean Anh Nguyen, Seal Beach, CA (US)

(73) Assignee: The Boeing Company, Chicago, IL (US)

( * ) Notice: Subject to any disclaimer, the term of this patent is extended or adjusted under 35 U.S.C. 154(b) by 200 days.

(21) Appl. No.: 17/949,364

(22) Filed: Sep. 21, 2022

(65) Prior Publication Data

US 2023/0377812 A1   Nov. 23, 2023

Related U.S. Application Data

(60) Provisional application No. 63/344,652, filed on May 23, 2022.

(51) Int. Cl.
*H01H 1/60* (2006.01)
*G01R 31/327* (2006.01)

(52) U.S. Cl.
CPC ........ *H01H 1/605* (2013.01); *G01R 31/3277* (2013.01)

(58) Field of Classification Search
CPC .. H01H 1/605; G01R 31/327; G01R 31/3277; G01R 27/00; G01R 27/20; G01R 27/205
See application file for complete search history.

(56) References Cited

U.S. PATENT DOCUMENTS

| 2015/0187519 A1* | 7/2015 | Jefferies | H01H 1/605 307/109 |
| 2016/0238658 A1* | 8/2016 | Edwards | G01R 31/3277 |

OTHER PUBLICATIONS

A Diagnostic to Validate Wetting Current and Measure Switch Contact Resistance Degradation (Year: 2014).*

* cited by examiner

*Primary Examiner* — Son T Le
(74) *Attorney, Agent, or Firm* — Joseph M. Butscher; The Small Patent Law Group LLC

(57) ABSTRACT

A system, a method, a device, and an apparatus include a control unit configured to determine contact resistance of one or more electrical contacts of one or more circuits, and remove, via a wetting current, residue on the one or more electrical contacts.

20 Claims, 7 Drawing Sheets

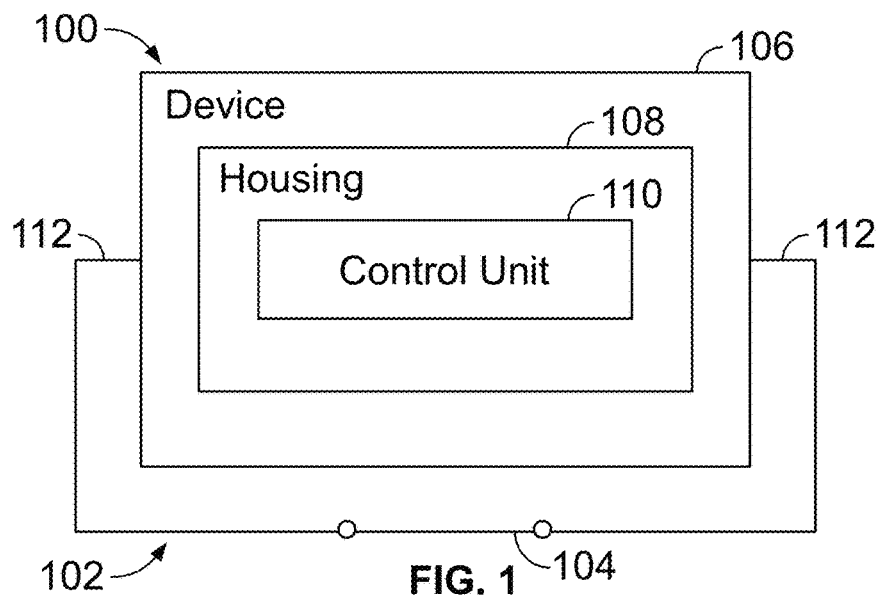
FIG. 1
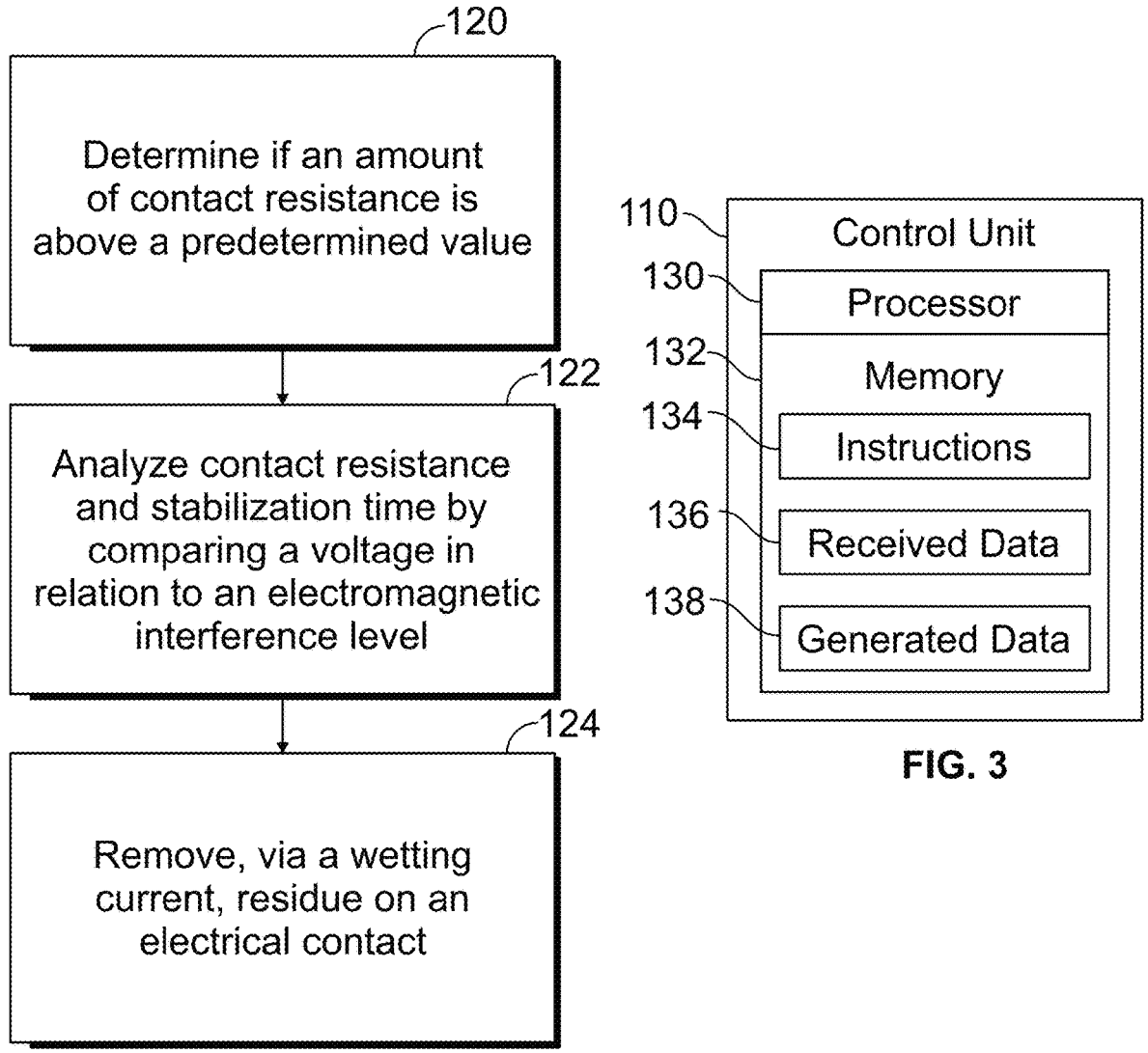
FIG. 2
FIG. 3

SYSTEMS AND METHODS FOR DETECTING AND REMOVING RESIDUE FROM LOW CURRENT ELECTRICAL CONTACTS

RELATED APPLICATIONS

This application relates to and claims priority benefits from U.S. Provisional Patent Application No. 63/344,652, entitled "Systems and Methods for Detecting and Removing Residue from Low Current Electrical Contacts," filed May 23, 2022, which is hereby incorporated by reference in its entirety.

FIELD OF THE DISCLOSURE

Examples of the subject disclosure generally relate to systems and methods for detecting accumulation of debris and residue on low current electrical connections, which inhibit circuit conductivity and, more specifically, to systems and methods for identifying a poor electrical connection based on qualitive analysis and restoration of the connection via a wetting current apparatus.

BACKGROUND OF THE DISCLOSURE

Vehicles such as aircraft include thousands of mechanical electrical connections, typically including connectors, switches and relay contacts. Most of these devices carry low circuit current carrying less than 10 mA, typically providing position reporting information to ensure safe operation. Low current connectors include small diameter pins that maintain constant contact, while mechanical switches and relays are devices that provide momentary conductive paths after being activated physically, by moving, pressing, releasing, or touching contacts. In contrast, electronic switches, which do not require physical contact, are typically activated via semiconductor action.

During normal operation, low current contacts, can degrade over time due to development of a high resistance film (sulfidation, oxidation, hydrocarbons) on surfaces. Also, debris can accumulate with each actuation of switches and relays, interfering with normal circuit conductivity. A low current system, which typically lacks sufficient cleaning power, can be susceptible to continued build-up that increases the contact resistance causing a voltage drop and/or heating of the contacts until the contact causes an open circuit condition even when the contact is closed.

High contact resistance is accumulative for every connection in a circuit and can be exacerbated in flight due to vibration, moisture, temperature and pressure changes, or the like. Ground crews performing system operational tests may be unable to duplicate pilot reported failures when in-flight conditions are no longer present. As such, high resistance connections may remain undetectable, which can lead to periods of intermittent in-flight operation.

To prevent repeat in-flight anomalies, lacking clear objective test methodology, technicians are directed to replace multiple system components based on arbitrary and anecdotal information, which can lead to continued intermittent operation and further skew reliability data. Reliability improvements have historically led to an increase in contact pressure or use of special materials that have led to little or no improved performance for low current devices. For example, increased contact pressure may improve contact resistance, but also shortens component life due to increased wear, while use of special contact material involves additional cost.

SUMMARY OF THE DISCLOSURE

A need exists for a qualitive field-test for contacts. Further, a need exists for consistent contact testing, as various manufacturer contact testing can be inconsistent, and can result in defective components returned back to service with no faults found.

With those needs in mind, certain examples of the subject disclosure provide a system including a control unit configured to determine contact resistance of one or more electrical contacts of one or more circuits, and remove, via a wetting current, residue on the one or more electrical contacts.

In at least one example, the control unit is configured to determine if an amount of contact resistance is above a predetermined value. In at least one example, the control unit is further configured to analyze contact resistance and stabilization time by comparing a voltage in relation to an electromagnetic interference level.

In at least one example, the control unit is further configured to perform a final test to determine existence of circuit conductivity interference.

In at least one example, the system also includes a housing. The control unit is secured on or within the housing. The housing is configured to removably couple to the one or more circuits through one or more connections.

In at least one example, the wetting current is less than a nominal maximum current rating for the one or more electrical contacts.

In at least one example, the control unit is configured to apply a test current to the one or more circuits, cycle a connection in relation to the one or more circuits a predetermined number of times, determine steady behavior of the one or more circuits in response to a measurement for each cycle remaining within a predetermined threshold of a first measurement, and determine existence of an unacceptable amount of the residue in response to the measurement for each cycle exceeding the predetermined threshold of the first measurement.

In at least one example, the system also includes component test indicators, cycle indicators, a voltmeter, a switch selector, a power selector, an operation selector, a test indicator, and a cleaning indicator.

Certain examples of the present disclosure provide a method including determining, by a control unit, contact resistance of one or more electrical contacts of one or more circuits; and removing, via a wetting current applied by the control unit, residue on the one or more electrical contacts.

Certain examples of the present disclosure provide a non-transitory computer-readable storage medium comprising executable instructions that, in response to execution, cause one or more control units comprising a processor, to perform operations comprising: determining contact resistance of one or more electrical contacts of one or more circuits; and removing, via a wetting current, residue on the one or more electrical contacts.

BRIEF DESCRIPTION OF THE DRAWINGS

FIG. 1 illustrates a schematic block diagram of a system for testing a circuit, according to an example of the subject disclosure.

FIG. 2 illustrates a flow chart of a method for testing a circuit, according to an example of the subject disclosure.

FIG. 3 illustrates a schematic block diagram of a control unit, according to an example of the subject disclosure.

DETAILED DESCRIPTION OF THE DISCLOSURE

Figure 4:
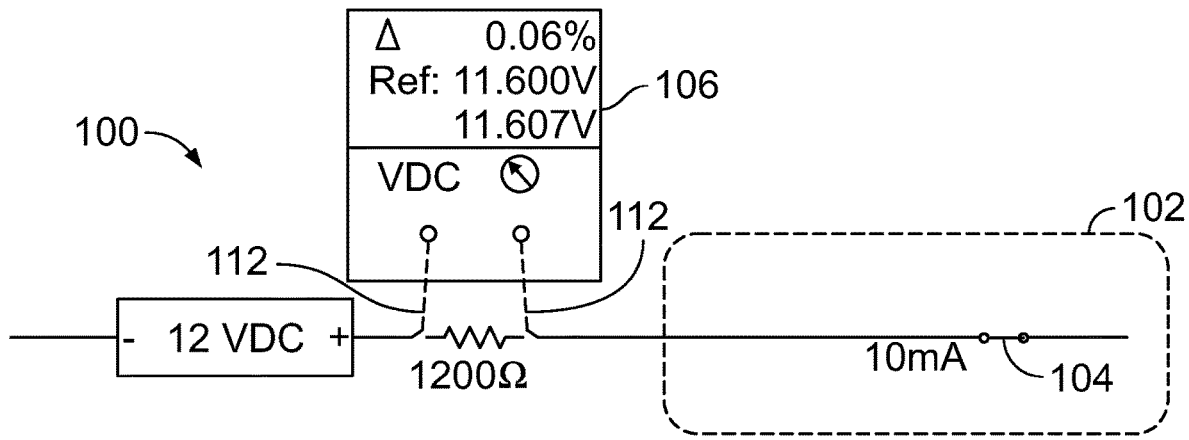
FIG. 4 illustrates a simplified schematic diagram of the system, according to an example of the subject disclosure.

The foregoing summary, as well as the following detailed description of certain examples will be better understood when read in conjunction with the appended drawings. As used herein, an element or step recited in the singular and preceded by the word "a" or "an" should be understood as not necessarily excluding the plural of the elements or steps. Further, references to "one example" are not intended to be interpreted as excluding the existence of additional examples that also incorporate the recited features. Moreover, unless explicitly stated to the contrary, examples "comprising" or "having" an element or a plurality of elements having a particular condition can include additional elements not having that condition.

As described herein, systems, methods, devices, and apparatus are configured to detect and remove residue from low current electrical contacts. For example, testing includes determining if an amount of contact resistance is above a predetermined threshold, analyzing contact resistance and stabilization time by a relative comparison at a fixed voltage above vehicle electromagnetic interference (EMI) levels, removing any contact residue via wetting current, and based on final testing, determining if the component will or will not interfere with circuit conductivity.

Examples of the subject disclosure provide systems and methods for detecting contact resistance of one of more connections, such as within a vehicle. In at least one example, the method includes determining if an amount of contact resistance is above a predetermined threshold, analyzing contact resistance and stabilization time by a relative comparison at a fixed voltage above vehicle electromagnetic interference (EMI) levels, removing contact residue via a wetting current device, and based on final testing, determining if a component will or will not interfere with circuit conductivity.

In at least one example, the method can include determining a state of resistance in a connection or interconnected wiring over an initial period. The method can also determine resistance through a Resistive Capacitance Time Constant (RCTC) curve to determine stability (or instability) within 10 seconds, when the circuit is first connected to a device that provides a fixed power setting over electromagnetic interference levels of a vehicle.

In at least one example, the method also includes determining a state of resistance in a connection or interconnected wiring when the amount of resistance is greater than a relative percentage (such as 4%), when compared to a similar circuit having the same wire length, type and connectors.

In at least one example, the method also includes determining a state of resistance of a mechanical switch or relay contact when the amount of resistance is greater than a relative percentage (such as 1%) when compared to itself, after cycling the switch or relay contact.

In at least one example, the method also includes use of a fixed voltage and current to clean low current contacts of high resistance film, sulfidation or oxidation on the surface.

In at least one example, the method also includes determining if the use of cleaning current was effective at restoring contact health.

Certain examples of the subject disclosure provide a system for detecting and removing residue from an electrical contact. The system includes a device configured to determine if an amount of contact resistance is above a predetermined value, analyze contact resistance and stabilization time by comparing a voltage in relation to an electromagnetic interference level for a vehicle, and remove, via a wetting current, residue on the electrical contact. In at least one example, the device is further configured to perform a final test to determine existence of circuit conductivity interference.

Certain examples of the subject disclosure provide a method for detecting and removing residue from an electrical contact. The method includes determining if an amount of contact resistance is above a predetermined value, analyzing contact resistance and stabilization time by comparing a voltage in relation to an electromagnetic interference level for a vehicle, and removing, via a wetting current, residue on the electrical contact. In at least one example, the method also includes performing a final test to determine existence of circuit conductivity interference.

Certain examples of the subject disclosure provide a device configured to detect high resistance in a circuit and also facilitate contact cleaning. The device includes a power supply, current limiting resistors, control and select switches, voltmeter, display and indication lights. The device is configured to: determine if the amount of contact resistance is above a predetermined threshold, analyze contact resistance and stabilization time by a relative comparison at a fixed voltage above vehicle electromagnetic interference (EMI) levels, remove contact residue via wetting current, and facilitate final testing to ensure the circuit is free of residue that may interfere with circuit conductivity.

In at least one example, the power supply is fixed at 12.00 VDC.

In at least one example, a housing extends around the power supply, current limiting resistors, control and select switches, voltmeter, display and indication lights, and a handle is attached to the housing for grasping by a user when transporting the device.

In at least one example, the power source, current limiting resistors, and processing circuitry to determine contact health and provide cleaning are integrated into the aircraft.

FIG. 1 illustrates a schematic block diagram of a system 100 for testing a circuit 102, according to an example of the subject disclosure. The circuit 102 includes at least one electrical contact 104. In at least one example, the system 100 is configured to detect and remove residue from the electrical contact 104.

The system 100 includes a device 106 that includes a housing 108. A control unit 110 is secured on and/or within the housing 108. The housing 108 removably couples to (for example, is configured to connect to and disconnect from, as desired) the circuit 102, such as through one or more connections 112 (for example, one or more leads, one or more traces, and/or the like). The connections 112 electrically couple the circuit 102 to the control unit 110.

When the device 106 is connected to the circuit 102, the control unit 110 operates to detect and remove residue from the electrical contact 104. In at least one example, the control unit 110 determines if an amount of contact resistance is above a predetermined value. The control unit 110 also analyzes contact resistance and stabilization time by comparing a voltage in relation to an electromagnetic interference level for a vehicle (such as an aircraft). The control unit 110 further operates to remove, via a wetting current, residue on the electrical contact 104. In at least one example, the control unit 110 also performs a final test to determine existence of circuit conductivity interference (for example, to determine that the cleaning operation was effective to remove the residue).

The wetting current is a minimum electric current used to flow through the contact 104 and break through a surface film resistance. In at least one example, the wetting current is less than a nominal maximum current rating for the contact 104.

FIG. 2 illustrates a flow chart of a method for testing a circuit, according to an example of the subject disclosure. Referring to FIGS. 1 and 2, at 120, the control unit 110 determines if an amount of contact resistance is above a predetermined value. At 122, the control unit 110 analyzes contact resistance and stabilization time by comparing a voltage in relation to an electromagnetic interference level, such as for a vehicle. At 124, the control unit 110 removes, via a wetting current, residue on the electrical contact 104. In at least one example, the method also includes performing, by the control unit 110, a final test to determine existence of circuit conductivity interference.

FIG. 3 illustrates a schematic block diagram of the control unit 110, according to an example of the subject disclosure. In at least one example, the control unit 110 includes at least one processor 130 in communication with a memory 132. The memory 132 stores instructions 134, received data 136, and generated data 138. The control unit 104 shown in FIG. 3 is merely exemplary, and non-limiting.

As used herein, the term "control unit," "central processing unit," "CPU," "computer," or the like may include any processor-based or microprocessor-based system including systems using microcontrollers, reduced instruction set computers (RISC), application specific integrated circuits (ASICs), logic circuits, and any other circuit or processor including hardware, software, or a combination thereof capable of executing the functions described herein. Such are exemplary only, and are thus not intended to limit in any way the definition and/or meaning of such terms. For example, the control unit 110 can be or include one or more processors that are configured to control operation, as described herein.

The control unit 110 is configured to execute a set of instructions that are stored in one or more data storage units or elements (such as one or more memories), in order to process data. For example, the control unit 110 can include or be coupled to one or more memories. The data storage units can also store data or other information as desired or needed. The data storage units can be in the form of an information source or a physical memory element within a processing machine.

The set of instructions may include various commands that instruct the control unit 110 as a processing machine to perform specific operations such as the methods and processes of the various examples of the subject matter described herein. The set of instructions can be in the form of a software program. The software can be in various forms such as system software or application software. Further, the software can be in the form of a collection of separate programs, a program subset within a larger program, or a portion of a program. The software can also include modular programming in the form of object-oriented programming. The processing of input data by the processing machine may be in response to user commands, or in response to results of previous processing, or in response to a request made by another processing machine.

The diagrams of examples herein illustrate one or more control or processing units, such as the control unit 110. It is to be understood that the processing or control units can represent circuits, circuitry, or portions thereof that may be implemented as hardware with associated instructions (e.g., software stored on a tangible and non-transitory computer readable storage medium, such as a computer hard drive, ROM, RAM, or the like) that perform the operations described herein. The hardware can include state machine circuitry hardwired to perform the functions described herein. Optionally, the hardware can include electronic circuits that include and/or are connected to one or more logic-based devices, such as microprocessors, processors, controllers, or the like. Optionally, the control unit 110 can represent processing circuitry such as one or more of a field programmable gate array (FPGA), application specific integrated circuit (ASIC), microprocessor(s), and/or the like. The circuits in various examples may be configured to execute one or more algorithms to perform functions described herein. The one or more algorithms can include aspects of examples disclosed herein, whether or not expressly identified in a flowchart or a method.

As used herein, the terms "software" and "firmware" are interchangeable, and include any computer program stored in a data storage unit (for example, one or more memories) for execution by a computer, including RAM memory, ROM memory, EPROM memory, EEPROM memory, and non-volatile RAM (NVRAM) memory. The above data storage unit types are exemplary only, and are thus not limiting as to the types of memory usable for storage of a computer program.

FIG. 4 illustrates a simplified schematic diagram of the system 100, according to an example of the subject disclosure. In at least one example, the system 100 is configured for contact resistance testing. The system 100 is configured to test the circuit 102, such as can be within a vehicle, such as an aircraft. The circuit 102 includes at least one electrical contact 104. FIG. 4 shows an example of a 12 VDC/10 mA test indicating the circuit 102 is good or otherwise acceptable.

Figure 5:
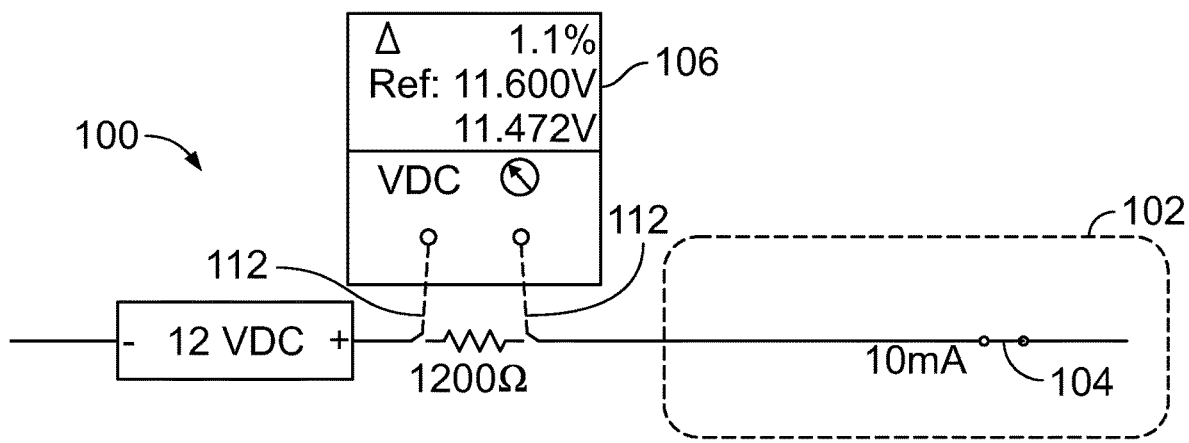
FIG. 5 illustrates a simplified schematic diagram of the system, according to an example of the subject disclosure.

FIG. 5 illustrates a simplified schematic diagram of the system 100. In contrast to FIG. 4, FIG. 5 shows an example of a 12 VDC/10 mA test indicating the circuit 102 is poor or otherwise unacceptable.

Referring to FIGS. 1-5, the system 100 is configured to perform a test in relation to the circuit 102 to evaluate various contacts, such as switches, relays, connectors, terminal contacts, and interconnected wiring. To perform the test, a test current is applied to the circuit 102, such as via the device 106. In particular, the control unit 110 operates to apply the test current to the circuit 102. For example, a 10 mA current can be applied to the circuit 102. A switch or relay contact can then be closed, if applicable. The control unit 110 of the device 106 records a resistance or voltage drop, ensuring rapid and non-erratic decrease in value with a stable measurement in a predetermined time frame (such as less than 10 seconds). The control unit 110 then cycles the connection (for example, the control unit 110 operates to open and close the contact 104) a predetermined number of times (such as three times, while the control unit 110 of the device 106 records a resistant or voltage drop for each cycle). The control unit 110 of the device 106 then performs an evaluation. For example, to ensure steady, non-erratic behavior under a recommended threshold, a measurement for each cycle can remain within 1% of a first measurement. Optionally, the recommended threshold can be greater than 1% (such as 2% or more), or less than 1% (such as 0.5% or less). Multiple measurements can be taken. For example, three or more measurements can be taken. If all the measurements are within 1% of the first measurement, then the control unit 110 determines that the contact 104 does not have an unacceptable amount of residue. If, however, the measurements differ from the first measurement (or the other measurements) by more than 1%, the control unit 110 can then determine that there is unacceptable amount of residue on the contact 104.

As shown in FIGS. 4 and 5, the system 100 (such as via the control unit 110) uses a relative percentage function of a meter to automate the difference measurement. After each application or contact cycle, the system 100 ensures a rapid decrease without an erratic reversal in value and measurement stability within a predetermined time period (such as within 10 seconds). In response to the difference between measurements being above the predetermined difference threshold (such as 1% difference), the control unit 110 of the device 106 can then subsequently apply the wetting current to remove residue from the contact 104. As noted, the predetermined difference threshold can be greater or less than a 1% difference.

Figure 6:
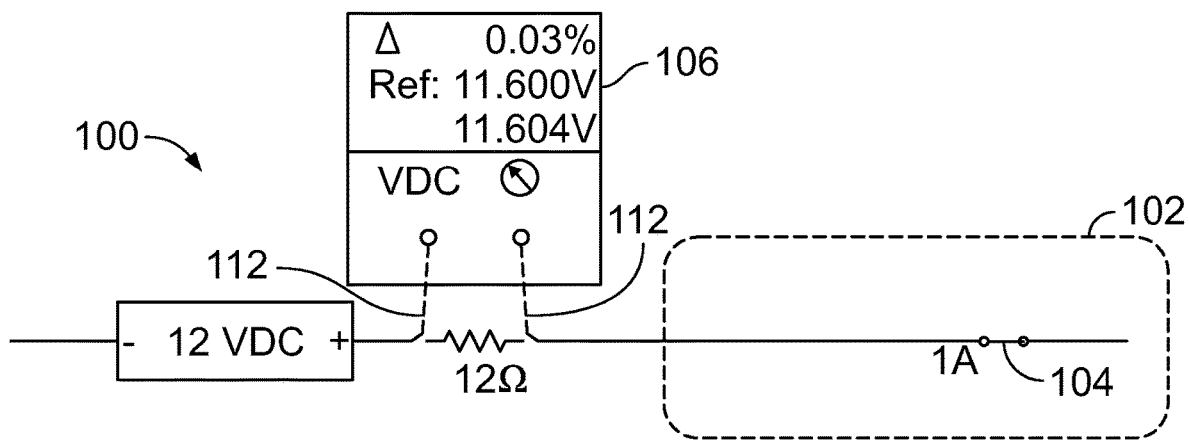
FIG. 6 illustrates a simplified schematic diagram of a system for contact cleaning, according to an example of the subject disclosure.

FIG. 6 illustrates a simplified schematic diagram of the system 100 for contact cleaning, according to an example of the subject disclosure. The contact cleaning procedure shown in FIG. 5 can be formed to clean various contacts 104, such as switches, relays, connectors, and terminal contacts.

Referring to FIGS. 1 and 6, in at least one example, the device 106 can be used to clean the contact 104. The control unit 110 operates so as not to exceed an amperage rating of the circuit 102. For example, the applied amperage does not exceed a maximum amperage specification for the contact 104 and interconnected wiring.

In order to clean the contact 104, the control unit 110 cycles the connection (for example, the contact 104 is opened and closed), while the control unit 110 monitors a resistance or voltage drop for each cycle. Cycling continues (such as up to ten times) until a rapid and non-erratic decrease in value with stable measurement (such as in less than ten seconds). To ensure steady, non-erratic behavior, a measurement for each cycle can remain within 1% of a first measurement. After each application or contact cycle, the control unit 110 ensures a rapid decrease with no erratic reversal in value and measurement stability, such as within ten seconds.

The device 106 including the control unit 110 is configured to determine if an amount of contact resistance is above a predetermined value (such as a 1% difference). The device 106 (such as via the control unit 110) analyzes resistance and stabilization time by comparing a voltage in relation to an electromagnetic interference level. The device 106 can then remove, via a wetting current, residue on the electrical contact 104. As noted, the wetting current is a minimum electric current used to flow through the contact 104 and break through a surface film resistance. The wetting current is below the nominal maximum current rating for the contact 104. As shown in FIG. 6, in at least one example, the wetting current can be 1 A. However, the wetting current can be greater or less than 1 A, depending on the nature of the contact 104. In at least one example, the device 106 is further configured to perform a final test to determine existence of circuit conductivity interference.

Figure 7:
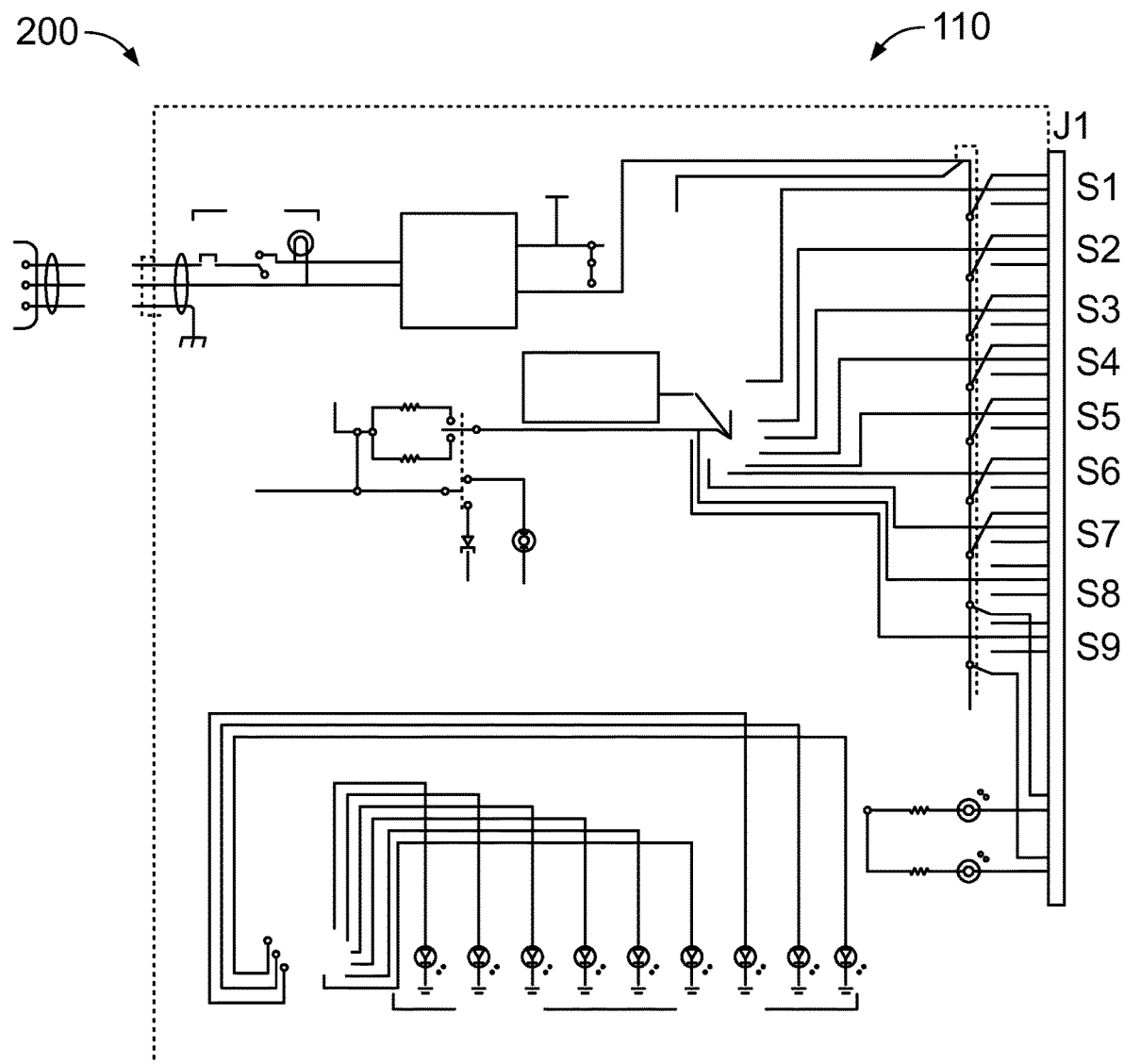
FIG. 7 illustrates a schematic electrical diagram for a test set, according to an example of the subject disclosure.

FIG. 7 illustrates a schematic electrical diagram for a test set 200, according to an example of the subject disclosure. For example, the test set 200 can be for an aircraft, and can be an auto throttle switchpack. Optionally, the test set 200 can be used for various other contacts in various other systems, apparatuses, devices, or the like. The auto throttle switchpack is merely an example of a system that can be tested.

As an example, the test set 200 is or otherwise includes the control unit 110. The control unit 110 can be configured as shown in FIG. 7. It is to be understood, however, that the configuration of the control unit 110 shown in FIG. 7 is merely exemplary. The control unit 110 can include more, less, and/or different components than shown in FIG. 7.

Figure 8:
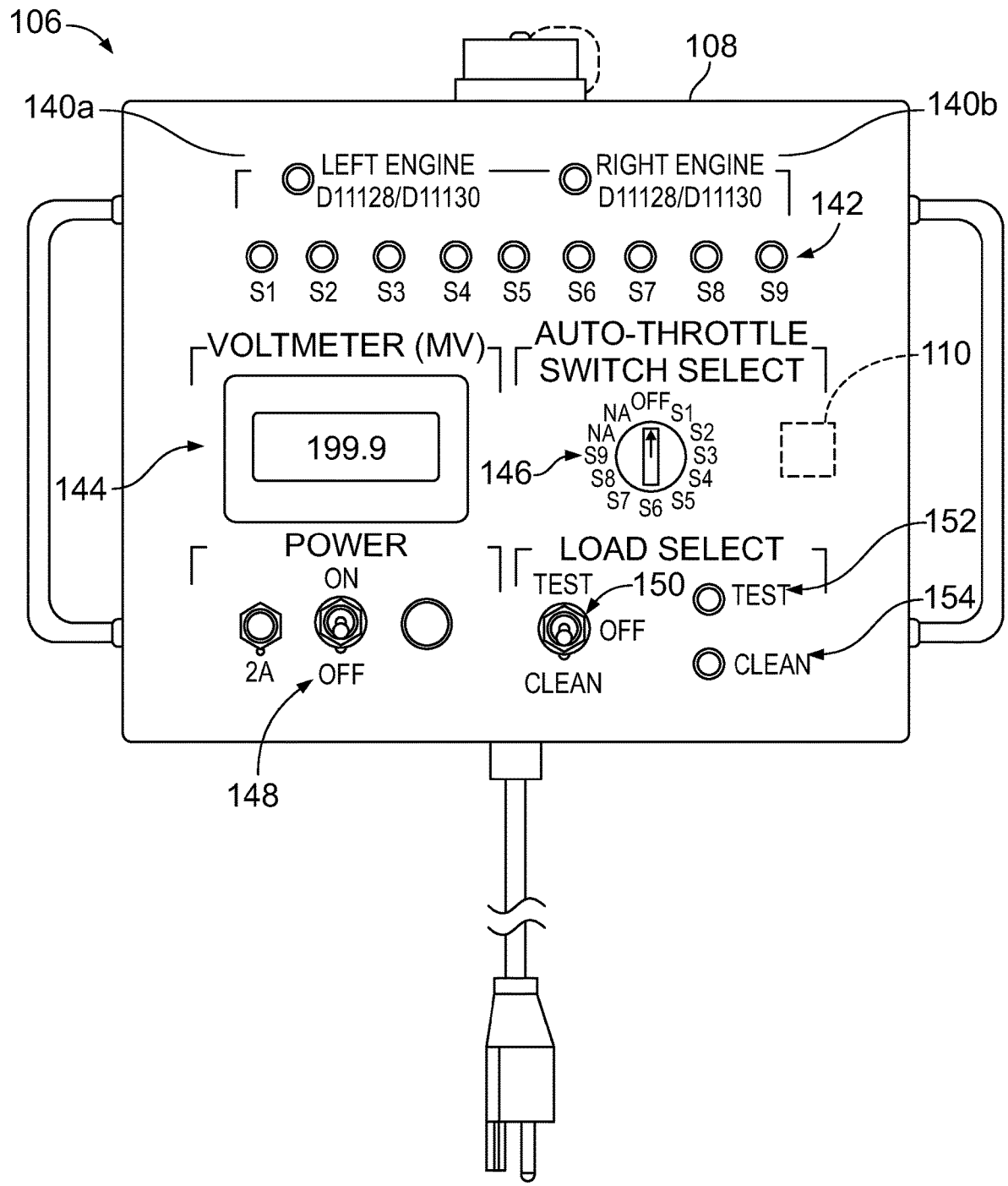
FIG. 8 illustrates a front view of a device for testing and cleaning a contact of a circuit, according to an example of the subject disclosure.

FIG. 8 illustrates a front view of the device 106 for testing and cleaning a contact of a circuit, according to an example of the subject disclosure. The device 106 can include electrical components, as shown in FIG. 7.

As an example, the device 106 includes the housing 108, which can be configured to be held by hand. As an example, the device 106 is configured to provide a test for an auto throttle switchpack for engines of an aircraft. Again, though, the device 106 can be used for various other contacts in various other systems, apparatuses, devices, or the like. The auto throttle switchpack is merely an example of a system that can be tested.

In at least one example, the device 106 includes component test indicators 140a and 140b, which can include features for indicating which component is being tested, such as text, graphics, lights, and/or the like. The example of FIG. 8 shows that the component test indicators 140a and 140b are for a left engine, and a right engine, respectively. The component test indicators 140a and 140b are secured to the housing 108, and are in communication with the control unit 110 (which can be contained within the housing 108) through one or more wired or wireless connections.

In at least one example, the device 106 also includes cycle indicators 142, which are configured to indicate a particular cycle of a test. The cycle indicators 142 can include features, such as text, graphics, lights, and/or the like. The cycle indicators 142 are secured to the housing 108 and are in communication with the control unit 110, such as through one or more wired or wireless connections.

In at least one example, the device 106 also includes a voltmeter 144, which can include a digital display for showing a detected voltage. The voltmeter 144 is in communication with the control unit 110, such as through one or more wired or wireless connections.

The device 106 also includes a switch selector 146, such as a dial. The switch selector 146 is in communication with the control unit 110, such as through one or more wired or wireless connections.

The device 106 also includes a power selector 148 in communication with the control unit 110, such as through one or more wired or wireless connections. The power selector 148 can be a switch that allows an individual to turn the device 106 on or off.

The device 106 also includes an operation selector 150, such as a switch, in communication with the control unit 110 through one or more wired or wireless connections. As shown, the operation selector 150 allows an individual to select between a test, a cleaning process, and deactivation.

The device 106 also includes a test indicator 152, such as a light, in communication with the control unit 110 through one or more wired or wireless connections. The test indicator 152 is configured to emit light energy to indicate when a test is being performed.

The device 106 also includes a cleaning indicator 154, such as a light, in communication with the control unit 110 through one or more wired or wireless connections. The cleaning indicator 154 is configured to emit light energy to indicate when a cleaning operation is being performed.

The device 106 shown in FIG. 8 is merely exemplary. The device 106 can include more or less features than shown. Further, the indicators can be configured differently than shown and described. For example, lights can be light emitting diodes. As another example, the device 106 can include a display, such as an electronic screen, that digitally provides the various features and indications. As another example, the device 106 can include a touchscreen interface instead of physical knobs, switches, and/or the like.

Figure 9:
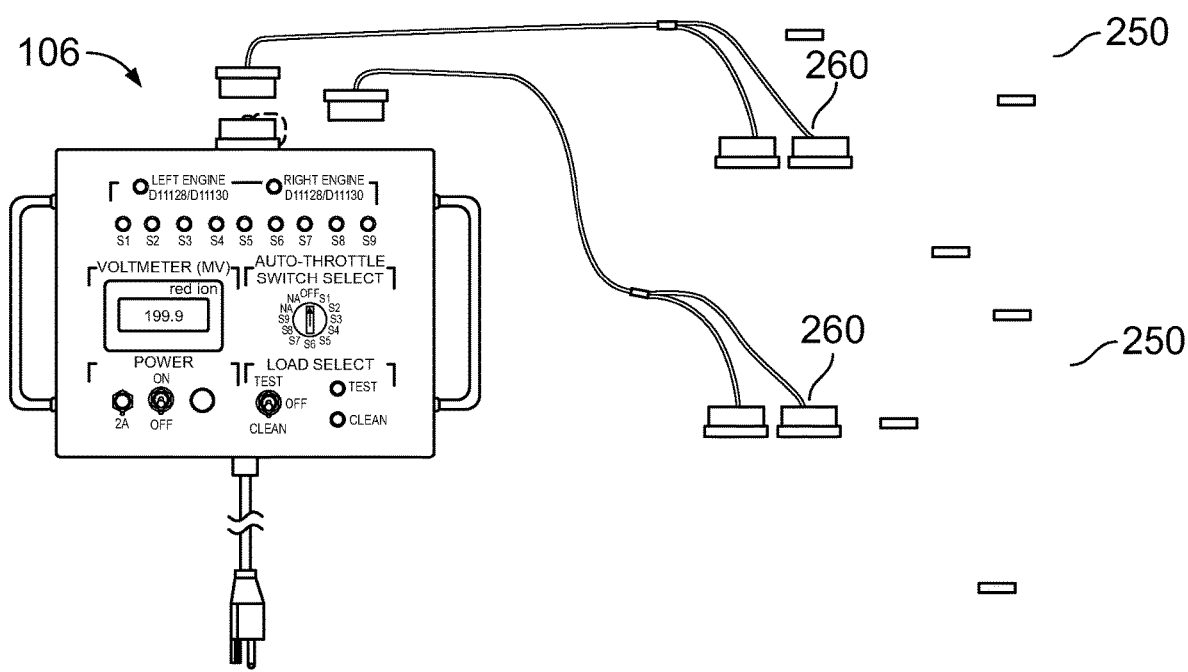
FIG. 9 illustrates a simplified view of the device of FIG. 8 coupled to components, according to an example of the subject disclosure.

FIG. 9 illustrates a simplified view of the device 106 of FIG. 8 coupled to components 250, according to an example of the subject disclosure. The device 106 connects to the components 250 at interface connections 260.

Figure 10:
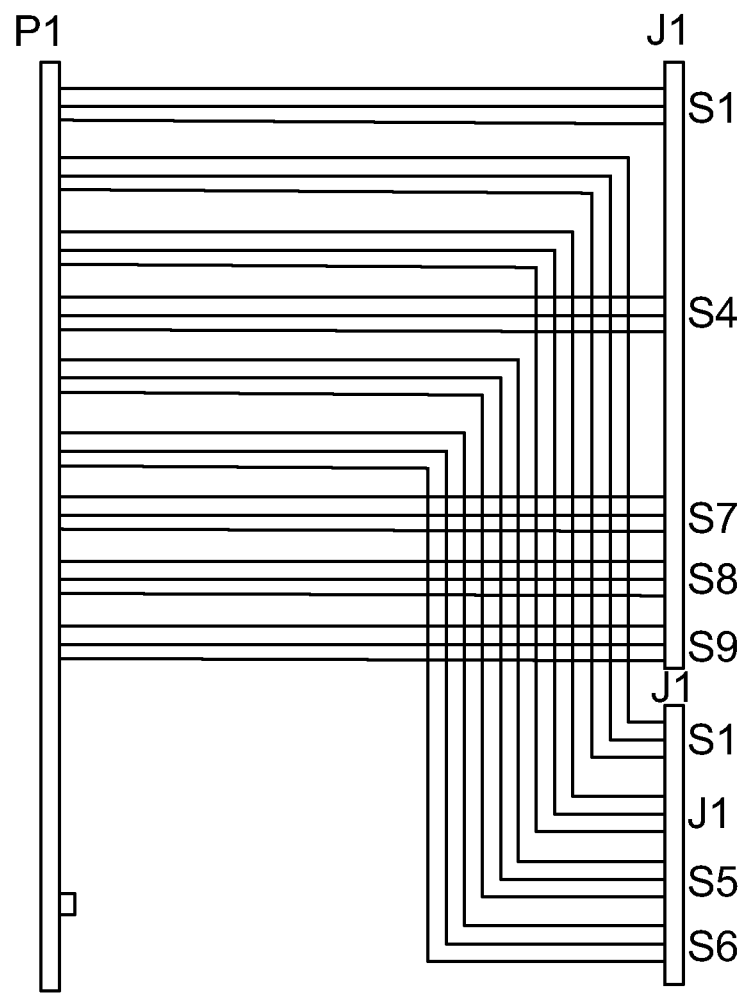
FIG. 10 illustrates a cable assembly and auto-throttle switchpack for an engine of an aircraft.
Figure 10:
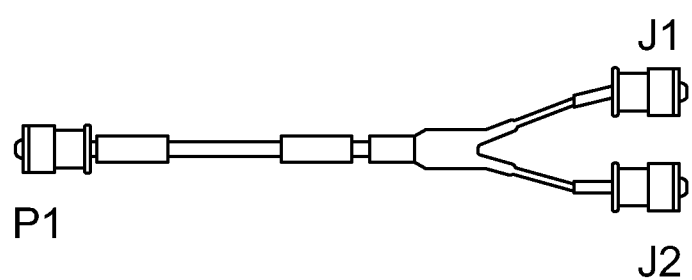

FIG. 10 illustrates a cable assembly and auto-throttle switchpack for an engine (such as a right or left engine) of an aircraft. Again, the auto-throttle switchpack is merely an example of a system that can be tested.

Figure 11:
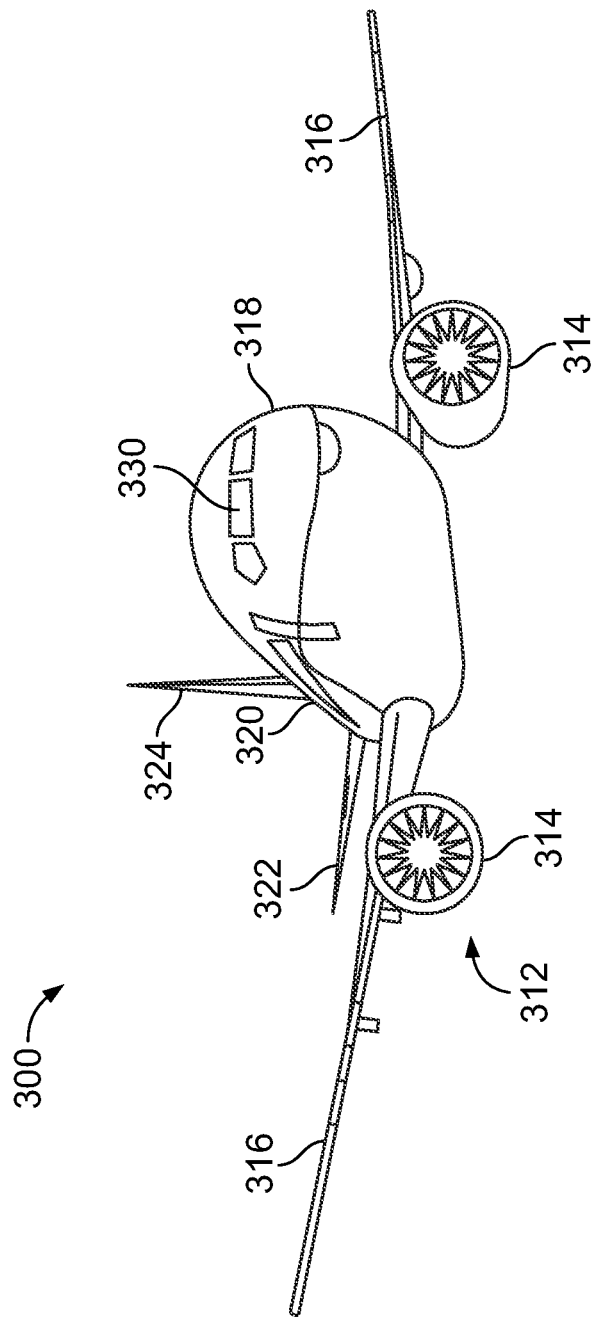
FIG. 11 illustrates a perspective front view of an aircraft, according to an example of the subject disclosure.

FIG. 11 illustrates a perspective front view of an aircraft 300, according to an example of the subject disclosure. The aircraft 300 includes a propulsion system 312 that includes engines 314, for example. Optionally, the propulsion system 312 may include more engines 314 than shown. The engines 314 are carried by wings 316 of the aircraft 300. In other examples, the engines 314 may be carried by a fuselage 318 and/or an empennage 320. The empennage 320 may also support horizontal stabilizers 322 and a vertical stabilizer 324. The fuselage 318 of the aircraft 3002 defines an internal cabin 330, which includes a flight deck or cockpit, one or more work sections (for example, galleys, personnel carry-on baggage areas, and the like), one or more passenger sections (for example, first class, business class, and coach sections), one or more lavatories, and/or the like. FIG. 11 shows an example of an aircraft 300. It is to be understood that the aircraft 300 can be sized, shaped, and configured differently than shown in FIG. 11. In one aspect, the device 106 can be used for maintenance of any low current systems onboard the aircraft 300. As an example, the device 106 can be used to detect degraded conditions that cause intermittent inflight flight deck effects.

The aircraft 300 includes various components having circuits that can be tested and cleaned by the systems and method described herein.

Further, the disclosure comprises examples according to the following clauses:

Clause 1. A system comprising:
a control unit configured to:
determine contact resistance of one or more electrical contacts of one or more circuits, and
remove, via a wetting current, residue on the one or more electrical contacts.

Clause 2. The system of Clause 1, wherein the control unit is configured to determine if an amount of contact resistance is above a predetermined value.

Clause 3. The system of Clause 2, wherein the control unit is further configured to analyze contact resistance and stabilization time by comparing a voltage in relation to an electromagnetic interference level.

Clause 4. The system of any of Clauses 1-3, wherein the control unit is further configured to perform a final test to determine existence of circuit conductivity interference.

Clause 5. The system of any of Clauses 1-4, further comprising a housing, wherein the control unit is secured on or within the housing, and wherein the housing is configured to removably couple to the one or more circuits through one or more connections.

Clause 6. The system of any of Clauses 1-5, wherein the wetting current is less than a nominal maximum current rating for the one or more electrical contacts.

Clause 7. The system of any of Clauses 1-6, wherein the control unit is configured to:
apply a test current to the one or more circuits,
cycle a connection in relation to the one or more circuits a predetermined number of times,
determine steady behavior of the one or more circuits in response to a measurement for each cycle remaining within a predetermined threshold of a first measurement, and
determine existence of an unacceptable amount of the residue in response to the measurement for each cycle exceeding the predetermined threshold of the first measurement.

Clause 8. The system of any of Clauses 1-7, wherein the system further comprises:
component test indicators;
cycle indicators;
a voltmeter;
a switch selector;
a power selector;
an operation selector;
a test indicator; and
a cleaning indicator.

Clause 9. A method comprising:
determining, by a control unit, contact resistance of one or more electrical contacts of one or more circuits; and
removing, via a wetting current applied by the control unit, residue on the one or more electrical contacts.

Clause 10. The method of Clause 9, wherein said determining comprises determining if an amount of contact resistance is above a predetermined value.

Clause 11. The method of Clause 10, further comprising analyzing, by the control unit, contact resistance and stabilization time by comparing a voltage in relation to an electromagnetic interference level.

Clause 12. The method of any of Clauses 9-11, further comprising performing, by the control unit, a final test to determine existence of circuit conductivity interference.

Clause 13. The method of any of Clauses 9-12, wherein the wetting current is less than a nominal maximum current rating for the one or more electrical contacts.

Clause 14. The method of any of Clauses 9-13, wherein said determining comprises:
applying a test current to the one or more circuits,
cycling a connection in relation to the one or more circuits a predetermined number of times, determining steady behavior of the one or more circuits in response to a measurement for each cycle remaining within a predetermined threshold of a first measurement, and determining existence of an unacceptable amount of the residue in response to the measurement for each cycle exceeding the predetermined threshold of the first measurement.

Clause 15. A non-transitory computer-readable storage medium comprising executable instructions that, in response to execution, cause one or more control units comprising a processor, to perform operations comprising:

determining contact resistance of one or more electrical contacts of one or more circuits; and removing, via a wetting current, residue on the one or more electrical contacts.

Clause 16. The non-transitory computer-readable storage medium of Clause 15, wherein said determining comprises determining if an amount of contact resistance is above a predetermined value.

Clause 17. The non-transitory computer-readable storage medium of Clause 16, further comprising analyzing contact resistance and stabilization time by comparing a voltage in relation to an electromagnetic interference level.

Clause 18. The non-transitory computer-readable storage medium of Clauses 15-17, further comprising performing a final test to determine existence of circuit conductivity interference.

Clause 19. The non-transitory computer-readable storage medium of any of Clauses 15-18, wherein the wetting current is less than a nominal maximum current rating for the one or more electrical contacts.

Clause 20. The non-transitory computer-readable storage medium of any of Clauses 15-20, wherein said determining comprises:

applying a test current to the one or more circuits, cycling a connection in relation to the one or more circuits a predetermined number of times, determining steady behavior of the one or more circuits in response to a measurement for each cycle remaining within a predetermined threshold of a first measurement, and determining existence of an unacceptable amount of the residue in response to the measurement for each cycle exceeding the predetermined threshold of the first measurement.

As described herein, examples of the subject disclosure provide qualitative field-testing systems and methods for electrical contacts. Further, examples of the subject disclosure include systems and methods that provide consistent contact testing.

While various spatial and directional terms, such as top, bottom, lower, mid, lateral, horizontal, vertical, front and the like can be used to describe examples of the subject disclosure, it is understood that such terms are merely used with respect to the orientations shown in the drawings. The orientations can be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described examples (and/or aspects thereof) can be used in combination with each other. In addition, many modifications can be made to adapt a particular situation or material to the teachings of the various examples of the disclosure without departing from their scope. While the dimensions and types of materials described herein are intended to define the parameters of the various examples of the disclosure, the examples are by no means limiting and are exemplary examples. Many other examples will be apparent to those of skill in the art upon reviewing the above description. The scope of the various examples of the disclosure should, therefore, be determined with reference to the appended claims, along with the full scope of equivalents to which such claims are entitled. In the appended claims and the detailed description herein, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various examples of the disclosure, including the best mode, and also to enable any person skilled in the art to practice the various examples of the disclosure, including making and using any devices or systems and performing any incorporated methods. The patentable scope of the various examples of the disclosure is defined by the claims, and can include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A system comprising:
a control unit configured to:
determine contact resistance of one or more electrical contacts of one or more circuits by applying a test current to the one or more circuits, cycling a connection in relation to the one or more circuits a predetermined number of times, determining steady behavior of the one or more circuits in response to a measurement for each cycle remaining within a predetermined threshold of a first measurement, and determining existence of an unacceptable amount of residue on the one or more electrical contacts in response to the measurement for each cycle exceeding the predetermined threshold of the first measurement, and
remove, via a wetting current, the residue on the one or more electrical contacts.

2. The system of claim 1, wherein the control unit is configured to determine if an amount of contact resistance is above a predetermined value.

3. The system of claim 2, wherein the control unit is further configured to compare a voltage in relation to an electromagnetic interference level.

4. The system of claim 1, wherein the control unit is further configured to perform a final test to determine existence of circuit conductivity interference.

5. The system of claim 1, further comprising a housing, wherein the control unit is secured on or within the housing, and wherein the housing is configured to removably couple to the one or more circuits through one or more connections.

6. The system of claim 1, wherein the wetting current is less than a nominal maximum current rating for the one or more electrical contacts.

7. The system of claim 1, wherein the system further comprises:
component test indicators;
cycle indicators;
a voltmeter;
a switch selector;
a power selector;
an operation selector;
a test indicator; and
a cleaning indicator.

8. A method comprising:
determining, by a control unit, contact resistance of one or more electrical contacts of one or more circuits, wherein said determining comprises:
applying a test current to the one or more circuits,
cycling a connection in relation to the one or more circuits a predetermined number of times,
determining steady behavior of the one or more circuits in response to a measurement for each cycle remaining within a predetermined threshold of a first measurement, and
determining existence of an unacceptable amount of residue on the one or more electrical contacts in response to the measurement for each cycle exceeding the predetermined threshold of the first measurement; and
removing, via a wetting current applied by the control unit, the residue on the one or more electrical contacts.

9. The method of claim 8, wherein said determining comprises determining if an amount of contact resistance is above a predetermined value.

10. The method of claim 9, further comprising comparing a voltage in relation to an electromagnetic interference level.

11. The method of claim 8, further comprising performing, by the control unit, a final test to determine existence of circuit conductivity interference.

12. The method of claim 8, wherein the wetting current is less than a nominal maximum current rating for the one or more electrical contacts.

13. A non-transitory computer-readable storage medium comprising executable instructions that, in response to execution, cause one or more control units comprising a processor, to perform operations comprising:
determining contact resistance of one or more electrical contacts of one or more circuits, wherein said determining comprises:
applying a test current to the one or more circuits,
cycling a connection in relation to the one or more circuits a predetermined number of times,
determining steady behavior of the one or more circuits in response to a measurement for each cycle remaining within a predetermined threshold of a first measurement, and
determining existence of an unacceptable amount of residue one the one or more electrical contacts in response to the measurement for each cycle exceeding the predetermined threshold of the first measurement; and
removing, via a wetting current, the residue on the one or more electrical contacts.

14. The non-transitory computer-readable storage medium of claim 13,
wherein said determining comprises determining if an amount of contact resistance is above a predetermined value.

15. The non-transitory computer-readable storage medium of claim 14, further comprising comparing a voltage in relation to an electromagnetic interference level.

16. The non-transitory computer-readable storage medium of claim 13, further comprising performing a final test to determine existence of circuit conductivity interference.

17. The non-transitory computer-readable storage medium of claim 13, wherein the wetting current is less than a nominal maximum current rating for the one or more electrical contacts.

18. The system of claim 1, wherein the control unit is further configured to record a voltage drop ensuring a decrease in valve with a stable measurement in a predetermined time frame.

19. The method of claim 8, wherein said determining the contact resistance further comprises recording a voltage drop ensuring a decrease in valve with a stable measurement in a predetermined time frame.

20. The non-transitory computer-readable storage medium of claim 13, wherein said determining the contact resistance further comprises recording a voltage drop ensuring a decrease in valve with a stable measurement in a predetermined time frame.

* * * * *